US009647622B1

(12) United States Patent
Jaeger et al.

(10) Patent No.: US 9,647,622 B1
(45) Date of Patent: May 9, 2017

(54) SYSTEM AND METHOD FOR OFFSET VOLTAGE CALIBRATION

(71) Applicant: Futurewei Technologies, Inc., Plano, TX (US)

(72) Inventors: Kent Jaeger, Cary, IL (US); Zhihang Zhang, Cary, NC (US); Matthew Miller, Arlington Heights, IL (US); Ramesh Chadalawada, Superior, IL (US)

(73) Assignee: FUTUREWEI TECHNOLOGIES, INC., Plano, TX (US)

( * ) Notice: Subject to any disclaimer, the term of this patent is extended or adjusted under 35 U.S.C. 154(b) by 0 days.

(21) Appl. No.: 14/920,671

(22) Filed: Oct. 22, 2015

(51) Int. Cl.
  *H03G 3/20* (2006.01)
  *H03G 3/30* (2006.01)
  *H03F 3/195* (2006.01)
  *H04B 1/40* (2015.01)
  *H04B 17/21* (2015.01)

(52) U.S. Cl.
  CPC ........... *H03G 3/3036* (2013.01); *H03F 3/195* (2013.01); *H04B 1/40* (2013.01); *H04B 17/21* (2015.01); *H03F 2200/294* (2013.01); *H03F 2200/375* (2013.01); *H03F 2200/451* (2013.01)

(58) Field of Classification Search
  CPC ........ H03F 1/02; H03F 2200/375; H03G 3/20
  USPC ......................................... 330/2, 9, 129, 254
  See application file for complete search history.

(56) References Cited

U.S. PATENT DOCUMENTS

| 7,933,361 B2 * | 4/2011 | Huang | H03D 3/008 330/129 |
| 8,026,761 B2 * | 9/2011 | Nolan | H03F 3/45197 330/254 |
| 2006/0244520 A1 * | 11/2006 | Wang | H03F 3/45753 330/9 |

* cited by examiner

*Primary Examiner* — Steven J Mottola
(74) *Attorney, Agent, or Firm* — Slater Matsil, LLP

(57) ABSTRACT

An embodiment method includes measuring, by a calibration device, a first output voltage of a variable gain amplifier (VGA) when the VGA is set at a first gain setting and measuring, by a calibration device, a second output voltage of the VGA when the VGA is set at a second gain setting different from the first gain setting. The method further includes calculating, by the calibration device, an offset voltage of a signal path including the VGA using the first output voltage and the second output voltage and calculating, by the calibration device, an internal offset voltage of the VGA using the first output voltage and the second output voltage.

20 Claims, 3 Drawing Sheets

SYSTEM AND METHOD FOR OFFSET VOLTAGE CALIBRATION

TECHNICAL FIELD

The present invention relates generally to integrated circuits, and, in particular embodiments, to a system and method for DC Offset voltage Correction for Variable Gain Amplifiers.

BACKGROUND

Generally, in a network device, various circuit elements are interconnected in order to filter, mix, amplify, and convert signals. There may be multiple stages of filtering and amplification in a signal's path, and each stage may contribute some offset voltage (e.g., error) to the signal as it is modified along the circuit. A variable gain amplifier (VGA) may be used in a signal's path (e.g., at a last stage of the path). The VGA may take a differential input signal (e.g., as modified by previous circuit elements in the path) and output an amplified differential signal or an amplified single ended signal However, the differential input signal may include an offset voltage of the signal path (e.g., error generated along the signal path). The VGA may also contribute an internal offset voltage to the signal. These offset voltages, if uncorrected, may be amplified by the VGA and reduce the usable amplitude range of the VGA output. Thus, calibration of the signal is desirable to counteract both the offset voltage of the input signal as well as the offset voltage internal to the VGA.

Calibration may include determining the offset voltage of the signal path and the offset voltage of the VGA. For example, the output of the VGA may be swept over its entire range while applying an offset correction voltage to the VGA until the output crosses zero. Alternatively, a binary or intelligent search may be conducted to arrive at these offset voltages. However, these methods require taking a large range of measurements, which may be time intensive and costly.

SUMMARY

These and other problems are generally solved or circumvented, and technical advantages are generally achieved, by embodiments of the present invention which includes a system and method for offset voltage calibration.

In accordance with an embodiment, a method includes measuring, by a calibration device, a first output voltage of a variable gain amplifier (VGA) when the VGA is set at a first gain setting and measuring, by a calibration device, a second output voltage of the VGA when the VGA is set at a second gain setting different from the first gain setting. The method further includes calculating, by the calibration device, an offset voltage of a signal path including the VGA using the first output voltage and the second output voltage and calculating, by the calibration device, an internal offset voltage of the VGA using the first output voltage and the second output voltage.

In accordance with another embodiment, a method for calibrating a circuit includes activating a circuit path with no input signal, wherein the circuit path includes a variable gain amplifier (VGA), setting, by a calibration device, the VGA to a first gain step, measuring, by the calibration device, a first output voltage of the VGA when the VGA is set to the first gain step, setting, by the calibration device, the VGA to a second gain step, and measuring, by the calibration device, a second output voltage of the VGA when the VGA is set to the second gain step. The first gain step and the second gain step are different. The method further includes calculating, by the calibration device, a first offset voltage and a second offset voltage in accordance with the first output voltage, the second output voltage, the first gain step, and the second gain step. The first offset voltage is an offset voltage caused by circuit elements in the circuit path prior to the VGA, and the second offset voltage is an internal offset voltage of the VGA. The method further includes calculating, by the calibration device, offset correction voltages for different gain steps of the VGA in accordance with the first offset voltage and the second offset voltage and configuring, by the calibration device, a DC offset correction (DCOC) digital to analog convertor (DAC) with the offset correction voltages for the different gain steps of the VGA.

In accordance with yet another embodiment, a calibration system includes a signal circuit having a variable gain amplifier (VGA); and a dc offset correction (DCOC) digital to analog convertor (DAC) applying an offset correction voltage to the VGA. The calibration system further includes a calibration circuit electrically connected to the signal circuit. The calibration circuit is configured to measure a first output voltage of a variable gain amplifier (VGA) when the VGA is set at a first gain setting; measure a second output voltage of the VGA when the VGA is set at a second gain setting different from the first gain setting; and calculate an offset voltage of the signal circuit and an internal offset voltage of the VGA using the first output voltage and the second output voltage. The calibration system is further configured to calculate offset correction voltages corresponding to different gain settings of the VGA in accordance with the offset voltage of the signal circuit and the internal offset voltage of the VGA.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Various embodiments are described within a specific context, namely DC offset voltage correction for a receiver (RX) circuit path in a transceiver device. However, various embodiment devices may be used in any integrated circuit where calibration is desired.

Various embodiments include a calibration system for DC offset voltage correction in a RX circuit path of a transceiver. The DC offset voltage correction may occur at a last stage of the RX path (e.g., at a variable gain amplifier (VGA)).

During calibration, the VGA is set to two different gain settings (also referred to as gain steps), and the output of each setting is measured using an analog to digital convertor (ADC), for example. The offset voltage of the signal path (e.g., offset voltage to the signal caused by various elements along the RX path) as well as the internal offset voltage of the VGA is calculated in accordance with the two output measurements of the two gain settings. Knowing these offset voltages, a suitable offset correction voltage may be calculated for each gain step of the VGA. As the VGA gain is changed during operation of the transceiver, a suitable offset correction voltage can be applied by a DC offset voltage correction (DCOC) digital to analog convertor (DAC), which feeds into the VGA. Thus, the DC offset voltage calculation may be achieved by taking as few as two measurements, which allows for fast and accurate calibration of a circuit path.

Figure 1:
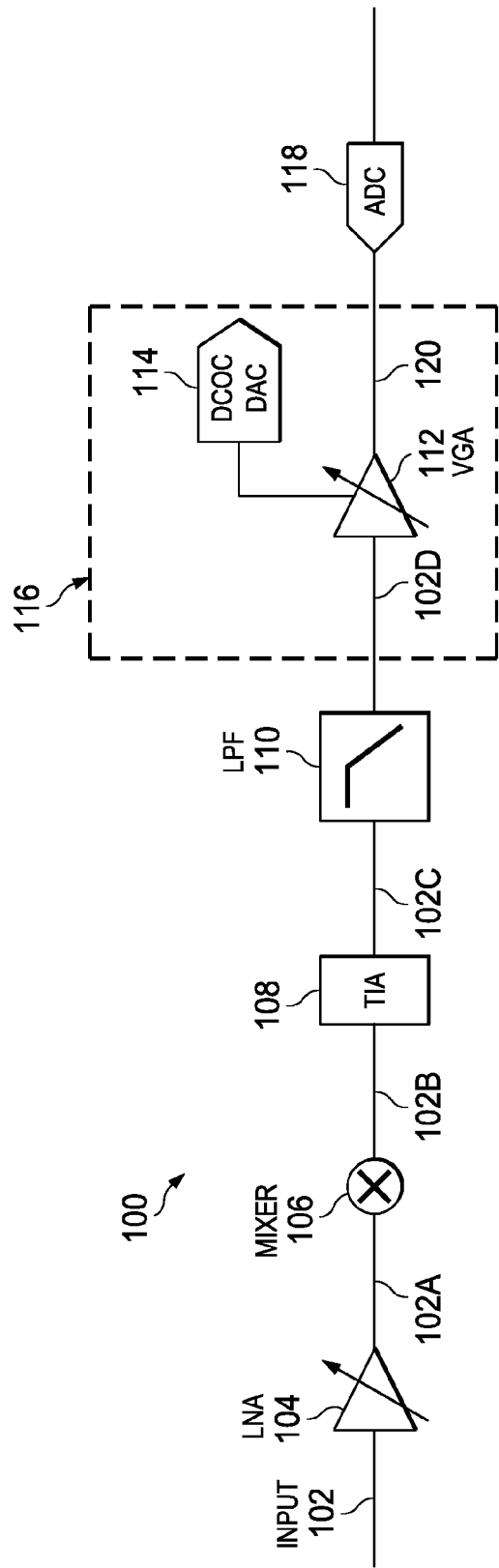
FIGS. 1 and 2 are block diagrams of circuit paths in accordance with some embodiments.

FIG. 1 illustrates an example RX path lineup 100, which may be used in a transceiver to amplify, mix, and/or filter a received signal, for example. The various elements of RX path 100 are for illustration sake only, and various embodiments may include any combination of the illustrated elements as well as additional elements depending on device design. RX path 100 may take an input signal 102, which may be a differential signal. Signal 102 may be amplified by low noise amplified (LNA) 104 to achieve an amplified signal 102A. Amplified signal 102A may be mixed with other signals by a mixer 106 to achieve a mixed signal 102B. For example, the signal 102 may be a high frequency radio signal and the mixer acts as a downconverter to convert the desired portion of the radio spectrum to a lower frequency for further processing. Mixed signal 102B may further be amplified by a trans-impedance amplifier (TIA) 108 to achieve an amplified signal 102C. Amplified signal 102C may then be filtered by a low pass filter (LPF) 110 in order to remove or at least reduce high frequency noise and signals, for example, to generate a filtered signal 102D. Filtered signal 102D applies an input voltage $V_{in}$ to VGA 112, which amplifies $V_{in}$ and generates an output signal 120 having an output voltage $V_{out}$. In an embodiment, VGA 112 is an inverting amplifier. In another embodiment, VGA 112 may be a non-inverting amplifier. Output signal 120 may then be measured by ADC 118. Output signal 120 may be a differential signal or a single ended signal.

The input to VGA 112 (e.g., filtered signal 102D) is a differential signal that may include an offset voltage $V_{OS1}$ generated at least in part by various elements in the RX lineup prior to VGA 112 (e.g., LNA 104, mixer 106, TIA 108, and LPF 110). Furthermore, VGA 112 may also contribute an internal offset voltage $V_{OS2}$ to output voltage $V_{out}$, which further increases the error of output signal 120. In order to counteract this error, an offset correction voltage may be applied in calibration portion 116 of RX path 100. In various embodiments, a DCOC DAC 114 applies an offset correction voltage $V_{DCOC}$ to a summing node of VGA 112. During operation of RX path 100, offset correction voltage $V_{DCOC}$ is selected in accordance with a selected gain setting of VGA 112, offset voltage $V_{OS1}$ of the signal path, and internal offset voltage $V_{OS2}$ of VGA 112.

In some embodiments, the output voltage $V_{out}$ of VGA 112 operating with DCOC DAC 114 can be modeled in accordance with Equation (1), below:

$$V_{out} = GV_{in} + \frac{V_{OSAMP}}{f} + I_{DCOC}RG \quad (1)$$

where G is the gain of VGA 112, $V_{in}$ is a function of offset voltage $V_{OS1}$, $V_{OSAMP}$ is the input offset voltage internal to VGA 112, f is the feedback factor of passive components around VGA 112, and $I_{DCOC}R$ is the offset correction voltage $V_{DCOC}$.

In an embodiment, feedback factor f is substantially constant over the different gain steps of VGA 112. In such embodiments, the internal offset voltage $V_{OS2}$ of VGA 112 is constant and equals $$\frac{V_{OSAMP}}{f}$$

for all gain steps of VGA 112. Thus, when feedback factor f is substantially constant, Equation (1) can also be expressed as:

$$V_{out} = GV_{in} + V_{OS2} + I_{DCOC}RG \quad (2)$$

In such embodiments, feedback factor f may be approximated as substantially constant for all gain steps of VGA 112. In other embodiments, feedback factor f varies but is predictable for different gain steps of VGA 112 as will be described in greater detail below.

In the above embodiment, DCOC DAC 114 generates a current $I_{DCOC}$, and R is the resistance by which current $I_{DCOC}$ creates voltage $V_{DCOC}$ (e.g., $V_{DCOC}=I_{DCOC}R$). In various embodiments, R may be configured to remain constant through all gain steps of VGA 112. Furthermore, $V_{DCOC}$ may adjust $V_{out}$ linearly over the current range of DCOC DAC 114, but $V_{DCOC}$ corrects $V_{out}$ in accordance with changes in the gain setting (e.g., gain G) of VGA 112. Thus, once offset voltages $V_{O1}$ and $V_{O2}$ from RX path 100 and VGA 112 are calibrated out of the output signal, changing the gain setting of VGA 112 will not require new calibration.

Figure 2:
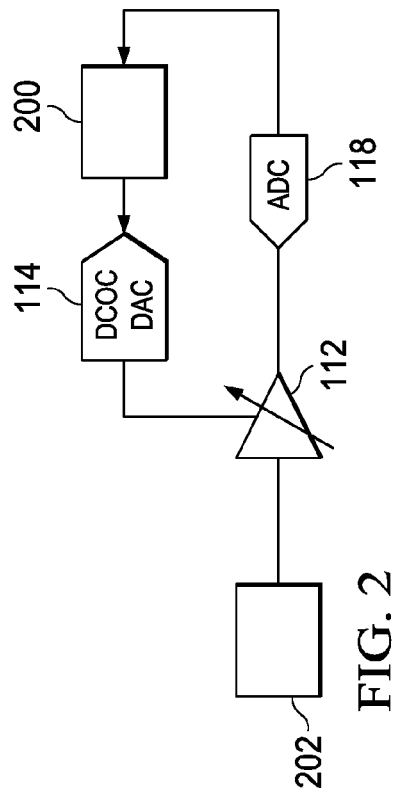

FIG. 2 illustrates a block diagram of RX path 100 during calibration. Calibration of RX path 100 may occur at any time, such as, during manufacture, during field operations, combinations thereof, and the like. In some embodiments, an automated calibration device, such as, a baseband chip 200 (also referred, may perform calibration of RX path 100 although other devices (e.g., other calibration circuits) or manual calibration may be used in other embodiments. In some embodiments, baseband chip 200 controls signal reception and transmission in the transceiver device, and baseband chip 200 includes circuitry (e.g., a processor) capable of measuring output voltages, calculating offset voltages, calculating offset correction voltages, and programming DCOC DAC 114 with suitable offset correction voltages for different gain settings of VGA 112.

To initiate calibration, RX path 100 is activated with no input signal. Circuit block 202 represents elements of RX path 100 (e.g., LNA 104, mixer 106, TIA 108, and LPF 110) prior to VGA 112. Because no input signal is activated, the output of circuit block 202 is equivalent to offset voltage $V_{OS1}$ of the signal path (e.g., caused by elements in circuit block 202). Thus, during calibration, as illustrated by FIG. 2, the input voltage $V_{in}$ of VGA 112 is equivalent to $V_{OS1}$. Assuming feedback factor f is constant, output voltage $V_{out}$ of VGA 112 during calibration can be expressed as:

$$V_{out} = GV_{OS1} + V_{OS2} + I_{DCOC}RG \quad (3)$$

During calibration, a constant calibration offset correction voltage $V_{DCOC'}$ may also be applied by DCOC DAC 114, and the calibration offset correction voltage $V_{DCOC'}$ is known by the calibration mechanism (e.g., baseband chip 200). For example, DCOC DAC 114 may be configured to generate a known, calibration offset correction current $I_{DCOC'}$. In an embodiment, calibration offset correction current $I_{DCOC'}$ may be set to center code, and an approximation for calibration current $I_{DCOC'}$ would be 0 Amperes (A). However, in such embodiments, the center code may contribute half a least significant bit (LSB) of calibration offset current to the output voltage. In an embodiment, the calibration offset current can also be added to the below offset voltage calculations (e.g., as a constant) for improved accuracy. In other embodiments, the calibration offset correction may be omitted from the below calculations.

After activating the circuit (e.g., RX path 100), baseband chip 200 (or another calibration mechanism) measures the output voltage $V_{out}$ of VGA 112 at two different gain steps (e.g., two different values of gain G). For example, the output voltage $V_{out}$ may be measured using ADC 118 for each gain step. Baseband chip 200 may then calculate $V_{OS1}$ and $V_{OS2}$ in accordance with the two output voltage $V_{out}$ measurements. In an embodiment, the calculation may be in accordance with:

$$V_{out1} = G_1 V_{OS1} + V_{OS2} + I_{DCOC'} R G_1 \quad (4)$$

$$V_{out2} = G_2 V_{OS1} + V_{OS2} + I_{DCOC'} R G_2 \quad (5)$$

where $G_1$ is a first selected gain step of VGA 112, and $V_{out1}$ is the measured output voltage of VGA 112 when $G_1$ is selected. $G_2$ is a second selected gain step for VGA 112, and $V_{out2}$ is the measured output voltage of VGA 112 when $G_2$ is selected. Gains $G_1$ and $G_2$ may be selected using any suitable criteria. In an embodiment, gain $G_1$ is selected to be about half way above a center gain setting of VGA 112 while gain $G_2$ is selected to be about half way below the center gain setting of VGA 112. In such embodiments, gain settings at edges (e.g., minimum and maximum) of VGA 112's ranges are avoided during calibration for improved output voltage measurement accuracy. In another embodiment, gain $G_1$ is selected to be a maximum gain setting of VGA 112 while gain $G_2$ is selected to be a minimum gain setting of VGA 112. In such embodiments, the variance between gain settings of VGA 112 is maximized during calibration for improved tracking of offset voltages. Any other gain step within VGA 112's range may also be selected. Furthermore, as described above, $I_{DCOC'} R$ for both equations is a known constant. Thus, offset voltages $V_{OS1}$ and $V_{OS2}$ can be calculated in accordance with Equations (4) and (5), above. The resulting equations for offset voltages $V_{OS1}$ and $V_{OS2}$ are:

$$V_{OS1} = \frac{V_{out2} - V_{out1}}{(G_2 - G_1)} - I_{DCOC'} R \quad (6)$$

$$V_{OS2} = \frac{G_2 V_{out1} - G_1 V_{out2}}{G_2 - G_1} \quad (7)$$

After baseband chip 200 (or other calibration mechanism) calculates offset voltages $V_{OS1}$ and $V_{OS2}$, offset correction current $I_{DCOC}$ for any gain setting of VGA 112 can be calculated according to Equation (8), below:

$$I_{DCOC} = \frac{-G V_{OS1} - V_{OS2}}{RG} \quad (8)$$

Baseband chip 200 may then program DCOC DAC 114 with a corresponding offset correction voltage $V_{DCOC}$ or offset correction current $I_{DCOC}$ for each gain setting of VGA 112 based on the above Equation (8). During operation of the circuit, DCOC DAC 114 applies an appropriate offset correction current $I_{DCOC}$ based on the programming and the selected gain setting of VGA 112. By applying the appropriate offset correction current $I_{DCOC}$, a suitable offset correction voltage $V_{DCOC}$ may be applied to VGA 112, which cancels or at least reduces the effect of offset voltages $V_{OS1}$ (e.g., offset voltage of the signal path) and $V_{OS2}$ (e.g., internal offset of VGA 112) on the output signal. Thus, as described above, baseband chip 200 (or other calibration mechanism) may calibrate an amplifier circuit (e.g., RX path 100) using two output voltage measurements, which allows for fast calibration of the circuit.

The above calculations are based on an assumption that feedback factor f for VGA 112 is constant. In another embodiment, feedback factor f may vary as the gain G of VGA 112 changes. In such embodiments, feedback factor f may be predictable and known for different gain steps. Calibration of the circuit may be similar to the steps described above. For example, the output voltages $V_{out1}$ and $V_{out2}$ can be measured for two different gain settings, $G_1$ and $G_2$, respectively. Feedback factors for the two different gains may be $f_1$ for gain $G_1$ and $f_2$ for gain $G_2$, where $f_1$ and $f_2$ are known but different. Calculations for offset voltages $V_{OS1}$ and $V_{OS2}$ may be in accordance with the following modified equations:

$$V_{out1} = G_1 V_{OS1} + \frac{V_{OS2}}{f_1} + I_{DCOC'} R G_1 \quad (9)$$

$$V_{out2} = G_2 V_{OS1} + \frac{V_{OS2}}{f_2} + I_{DCOC'} R G_2 \quad (10)$$

In such embodiments, offset voltages $V_{OS1}$ and $V_{OS2}$ can be calculated by the calibration mechanism (e.g., baseband chip 200) in accordance with Equations (11) and (12) below:

$$V_{OS1} = \frac{V_{out2} f_2 - V_{out1} f_1}{G_2 f_2 - G_1 f_1} - I_{DCOC'} R \quad (11)$$

$$V_{OS2} = \frac{G_2 V_{out1} - G_1 V_{out2}}{\frac{G_2}{f_1} - \frac{G_1}{f_2}} \quad (12)$$

Once offset voltages $V_{OS1}$ and $V_{OS2}$ are calculated, offset correction current $I_{DCOC}$ for any gain setting of VGA 112 can be calculated according to:

$$I_{DCOC} = \frac{-G V_{OS1} - \frac{V_{OS2}}{f}}{RG} \quad (13)$$

DCOC DAC 114 may then be programmed with an offset correction current $I_{DCOC}$ for all gain settings of VGA 112 as described above.

The above calculations are based on an assumption that the value of the correction voltage applied by DCOC DAC 114 is constant during calibration. In another embodiment, the correction voltage may vary between the two calibration measurements. In such embodiments, the value $I_{DCOC} R$ will be predictable and known for different gain steps.

Calibration of the circuit may be similar to the steps described above. For example, the output voltages $V_{out1}$ and $V_{out2}$ can be measured for two different gain settings, $G_1$ and $G_2$, respectively. Correction values applied by DCOC DAC 114 for the two different gains may be $I_{DCOC1}$ for the first gain $G_1$ and $I_{DCOC2}$ for the second gain $G_2$, where the offset calibration currents $I_{DCOC1}$ and $I_{DCOC2}$ are known but different. In the below equations, the feedback factor $f_1$ (corresponding to gain $G_1$) and $f_2$ (corresponding to gain $G_2$) may be different or the same for the two different gain settings. Calculations for offset voltages $V_{OS1}$ and $V_{OS2}$ may be in accordance with the following modified equations:

$$V_{out1} = G_1 V_{OS1} + \frac{V_{OS2}}{f_1} + I_{DCOC1} R G_1 \qquad (14)$$

$$V_{out2} = G_2 V_{OS1} + \frac{V_{OS2}}{f_2} + I_{DCOC2} R G_2 \qquad (15)$$

In such embodiments, offset voltages $V_{OS1}$ and $V_{OS2}$ can be calculated by the calibration mechanism (e.g., baseband chip 200) in accordance with Equations (16) and (17) below:

$$V_{OS1} = \frac{V_{out2} f_2 - V_{out1} f_1}{G_2 f_2 - G_1 f_1} + \left( \frac{I_{DCOC1} R G_1 - I_{DCOC2} R G_2}{G_2 f_2 - G_1 f_1} \right) \qquad (16)$$

$$V_{OS2} = \frac{G_2 V_{out1} - G_1 V_{out2}}{\frac{G_2}{f_1} - \frac{G_1}{f_2}} + \left( \frac{I_{DCOC1} R G_1 G_2 - I_{DCOC2} R G_1 G_2}{\frac{G_2}{f_1} - \frac{G_1}{f_2}} \right) \qquad (17)$$

Once offset voltages $V_{OS1}$ and $V_{OS2}$ are calculated, offset correction current $I_{DCOC}$ for any gain setting of VGA 112 can be calculated according to:

$$I_{DCOC} = \frac{-G V_{OS1} - \frac{V_{OS2}}{f}}{RG} \qquad (18)$$

DCOC DAC 114 may then be programmed with an offset correction current $I_{DCOC}$ for all gain settings of VGA 112 as described above.

Figure 3:
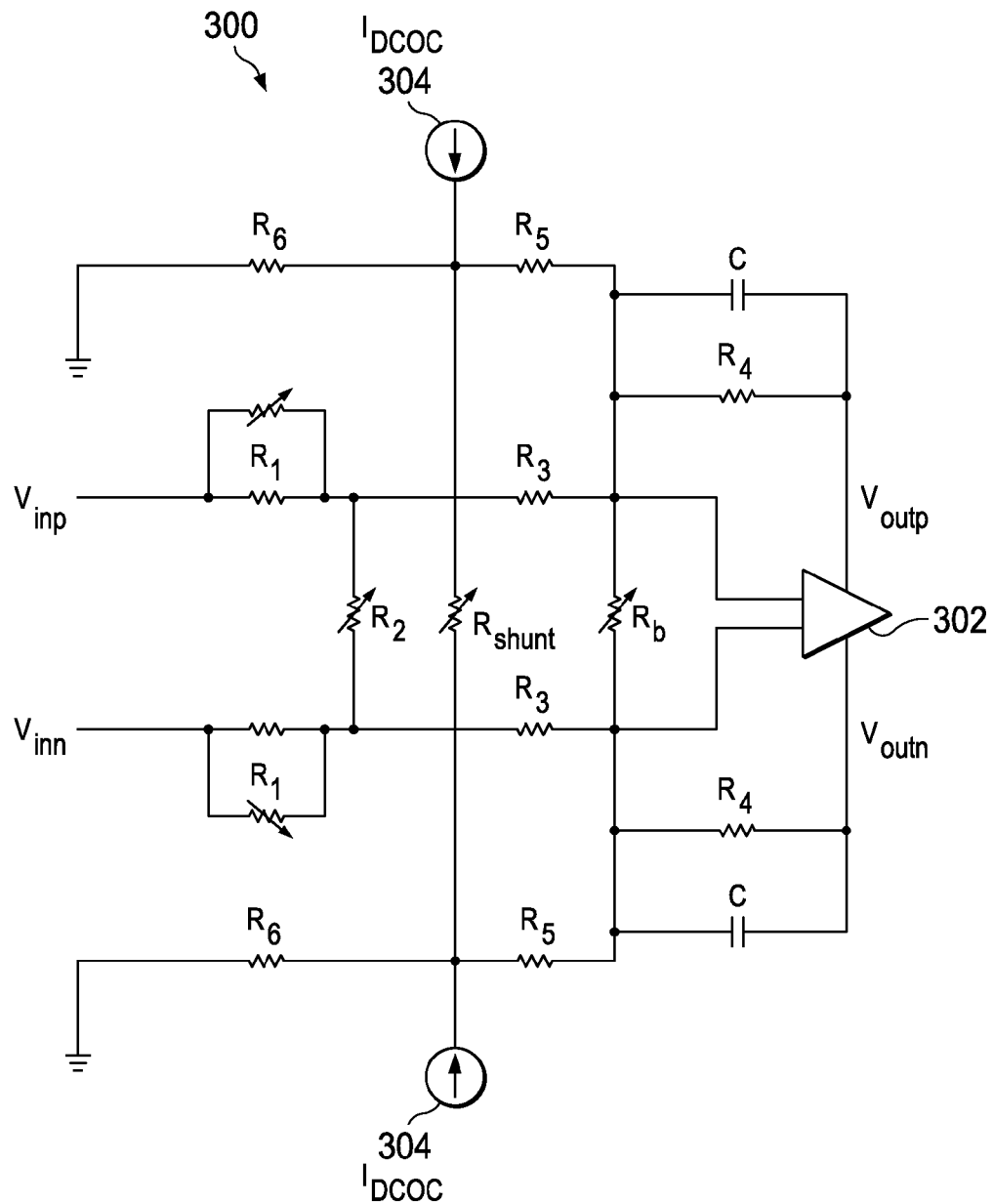
FIG. 3 is a diagram of an integrated circuit in accordance with some embodiments.

FIG. 3 illustrates a circuit 300 for implementing a VGA and DCOC DAC (e.g., VGA 112 and DCOC DAC 114) during normal operations and calibration in accordance with some embodiments. Circuit 300 provides only one example implementation of a VGA and DCOC DAC. Other suitable implementations, for example, having different circuit elements and/or different configurations may be used in other embodiments.

As illustrated by FIG. 3, a pair of differential input voltages $V_{inp}$ and $V_{inn}$ is applied to the input of a VGA, and a pair of differential output voltages $V_{outp}$ and $V_{outm}$ is generated by the circuit. During a normal operation mode of circuit 300 (e.g., outside of calibration mode), differential input voltages $V_{inp}$ and $V_{inn}$ represent an input signal as modified by various circuit elements in the circuit path prior to the VGA (e.g., block 202 in FIG. 2). For example, differential input voltages $V_{inp}$ and $V_{inn}$ may include offset voltage $V_{OS1}$ of the signal path. During a calibration mode of circuit 300, differential input voltages $V_{inp}$ and $V_{inn}$ represents the output of circuit elements in the RX path prior to the VGA (e.g., block 202 in FIG. 2) with no input signal activated. Thus, during calibration mode, differential input voltages $V_{inp}$ and $V_{inn}$ may be offset by offset voltage $V_{OS1}$ as described above.

In circuit 300, the VGA comprises an operational amplifier (op amp) 302 and resistors $R_1$, $R_2$, $R_3$, and $R_4$. Resistors $R_1$ and $R_2$ may include one or more resistors, which includes at least one variable resistor that can be controlled to alter a gain setting (e.g., G) of the VGA. Resistors $R_3$, and $R_4$ may also be included in circuit 300 to help set the gain setting of the VGA. In some embodiments, gain G of the VGA in circuit 300 can be generally expressed as:

$$G = \frac{R_4}{R_1 R_3 \left( \frac{1}{R_1} + \frac{1}{R_2} + \frac{1}{R_3} \right)} \qquad (19)$$

Capacitor C may also be optionally included in the VGA, for example, to create a feedforward zero in circuits with low-bandwidth op-amps. In other embodiments, capacitor C may be omitted. In some embodiments, a variable resistor $R_b$ in circuit 300 may also be included in order to maintain the feedback factor f of circuit 300 constant over different gain settings of the VGA. In other embodiments (e.g., when feedback factor f is variable), resistor $R_b$ may be omitted. Furthermore, in circuit 300, resistor $R_6$ may be optionally included to provide a path for the biasing current of the DCOC DAC 304.

Furthermore, during normal operation mode, a DCOC DAC supplies an offset correction current $I_{DCOC}$ to a resistor $R_{shunt}$, which applies a DC offset correction voltage $V_{DCOC}$ (e.g., $I_{DCOC} R$) to inputs of op amp 302. During calibration mode, a DCOC DAC supplies a constant calibration offset correction current $I_{DCOC'}$ to a resistor. In various embodiments, two current sources 304 configured in opposing directions are included in circuit 300 to provide a differential offset current $I_{DCOC}$ to the circuit. For example, when the differential offset current $I_{DCOC}$ is set to middle code (e.g., during calibration), both current sources 304 source the same amount of current into circuit 300, and the net differential offset current $I_{DCOC}$ equals 0 A. In another example, when the differential offset current $I_{DCOC}$ is set away from middle code, one current source 304 may source some current, and the other current source 304 may sink some current to result in a net non-zero differential offset current $I_{DCOC}$ being supplied to circuit 300. In circuit 300, resistors $R_5$ may be included to help offset correction current $I_{DCOC}$ injected at the inputs of op amp 302 track with the gain setting of the VGA. In some embodiments resistors $R_5$ may be about 40 kΩ although other values for resistors $R_5$ may be used in other embodiments. The various values of resistors in an embodiment circuit may be modified and selected based on device design as understood by one skilled in the art.

Resistor $R_{shunt}$ may be a variable resistor that is varied by DCOC DAC in accordance with the gain G of the VGA. For example, as described above, the resistance R (see equation 1) of the offset correction current $I_{DCOC}$ is modeled as constant across all gain settings of the VGA. In circuit 300, $R_{shunt}$ may be varied to provide an overall constant resistance for offset correction current $I_{DCOC}$ based on the gain G of the VGA. For example, the output voltage of circuit 300 is:

$$V_{out} = -V_{in} \frac{R_4}{R_1 R_3 \left(\frac{1}{R_1} + \frac{1}{R_2} + \frac{1}{R_3}\right)} + R_4 \frac{I_{DCOC} R_{shunt}}{R_5 + R_{shunt}} + \frac{V_{OSAMP}}{f} \quad (20)$$

Comparing Equations (1), (14), and (20) above, resistor $R_{shunt}$ may be varied in accordance with a selected gain G of the VGA in order to apply a constant overall resistance R (see Equation (1)) to $I_{DCOC}$ across all gain settings of the VGA. In various embodiments, the DCOC DAC may control both the offset correction current $I_{DCOC}$ and $R_{shunt}$ in circuit 300 in order to provide a suitable offset correction voltage $V_{DCOC}$ to the VGA.

Figure 4:
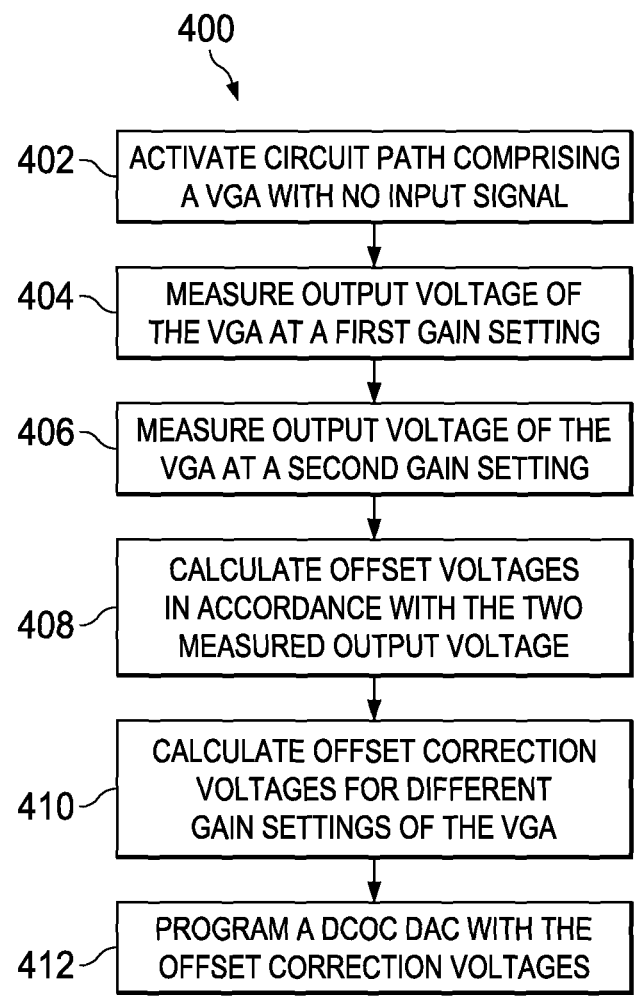
FIG. 4 is a process flow for performing calibration in accordance with some embodiments.

FIG. 4 illustrates a process flow 400 for calibrating a circuit according to various embodiments. In step 402 a circuit path (e.g., RX path 100) is activated with no input signal. The circuit path may include a VGA (e.g., VGA 112) at an end of the path. In step 404, the VGA is set to a first gain setting, and an output voltage of the VGA is measured. In step 406, the VGA is set to a second gain setting, which may be different than the first gain setting. The output of the VGA from the second gain setting is measured. During steps 404 and 406, a DCOC DAC (e.g., DCOC DAC 114) may apply a same calibration offset correction voltage or a different but known calibration offset correction voltage (e.g., $I_{DCOC'}$R) to a summing node of the VGA. In step 408, an offset voltage of the signal path (e.g., $V_{OS1}$) and an internal offset voltage of the VGA (e.g., $V_{OS2}$) are calculated using the two output voltage measurements from steps 404 and 406. In embodiments where the feedback factor of the VGA is constant across different gain settings, the offset voltages may be calculated using Equations (6) and (7) above. In another embodiment where the feedback factor of the VGA varies across different gain settings, the offset voltages may be calculated using Equations (11) and (12) above.

After the offset voltages are determined, offset correction voltages (e.g., $I_{DCOC}$R) for different gain settings of the VGA may be calculated in step 410. For example, the offset correction voltages may be calculated based in Equation (8) when the feedback factor is constant or based on equation (13) when the feedback factor varies. In step 412, a DCOC DAC is configured (e.g., programmed) in accordance with the different offset correction voltages determined in step 410. During normal operations of the device, the DCOC DAC may apply a suitable offset correction voltage based on this programming and a selected gain of the VGA.

Thus, as described above, various embodiments include a calibration system for offset voltage correction in a RX circuit path of a transceiver. The DC offset voltage correction may occur at a last stage of the RX path. For example, a DCOC DAC may apply a suitable offset correction voltage to a summing node of a VGA at the end of the RX path. During calibration, the VGA is set to two different gain settings (also referred to as gain steps) with no input signal being applied to the circuit path. The output voltage of each gain setting is measured. Based on the output voltages, an offset voltage of the signal path (e.g., offset voltage to the signal caused by various elements along the RX path) as well as the internal offset voltage of the VGA is calculated. Knowing these offset voltages, a suitable offset correction voltage may be calculated for each gain step of the VGA. As the VGA gain is changed during operation of the transceiver, a suitable offset correction voltage can be applied by a DC offset voltage correction (DCOC) digital to analog convertor (DAC), which feeds into the VGA. Thus, DC offset voltage calculation may be achieved by taking as few as two measurements, which allows for fast calibration of a circuit path.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method comprising:
   measuring, by a calibration device, a first output voltage of a variable gain amplifier (VGA) when the VGA is set at a first gain setting;
   measuring, by the calibration device, a second output voltage of the VGA when the VGA is set at a second gain setting different from the first gain setting;
   calculating, by the calibration device, an offset voltage of a signal path comprising the VGA using the first output voltage and the second output voltage; and
   calculating, by the calibration device, an internal offset voltage of the VGA using the first output voltage and the second output voltage.

2. The method of claim 1 further comprising calculating an offset correction voltage for each gain setting of the VGA using the offset voltage of the signal path and the internal offset voltage of the VGA.

3. The method of claim 2, further comprising programming, by the calibration device, a DC offset correction (DCOC) digital to analog convertor (DAC) with the offset correction voltage for different gain settings of the VGA.

4. The method of claim 3 further comprising applying, by the DCOC DAC, a same offset correction voltage to the VGA while measuring the first output voltage and measuring the second output voltage.

5. The method of claim 3 further comprising:
   applying, by the DCOC DAC, a first offset correction voltage to the VGA while measuring the first output voltage; and
   applying, by the DCOC DAC, a second offset correction voltage to the VGA while measuring the second output voltage, wherein the first offset correction voltage and the second offset correction voltage are different, and wherein calculating the offset voltage of the signal path and the internal offset voltage of the VGA are in accordance with the first offset correction voltage and the second offset correction voltage.

6. The method of claim 1, wherein measuring the first output voltage and measuring the second output voltage comprises measuring the first output voltage and measuring the second output voltage while the signal path is activated with no input signal.

7. The method of claim 1, wherein a feedback factor of the VGA varies across different gain settings of the VGA, and wherein calculating the offset voltage of the signal path and calculating the internal offset voltage of the VGA is in accordance with a first feedback factor corresponding to the first gain setting and a second feedback factor corresponding to the second gain setting.

8. The method of claim 1, wherein a feedback factor of the VGA is approximately constant across different gain settings of the VGA.

9. A method for calibrating a circuit comprising:
   activating a circuit path with no input signal, wherein the circuit path comprises a variable gain amplifier (VGA);

setting, by a calibration device, the VGA to a first gain step;

measuring, by the calibration device, a first output voltage of the VGA when the VGA is set to the first gain step;

setting, by the calibration device, the VGA to a second gain step, wherein the first gain step and the second gain step are different;

measuring, by the calibration device, a second output voltage of the VGA when the VGA is set to the second gain step;

calculating, by the calibration device, a first offset voltage and a second offset voltage in accordance with the first output voltage, the second output voltage, the first gain step, and the second gain step, wherein the first offset voltage is an offset voltage caused by circuit elements in the circuit path prior to the VGA, and wherein the second offset voltage is an internal offset voltage of the VGA;

calculating, by the calibration device, offset correction voltages for different gain steps of the VGA in accordance with the first offset voltage and the second offset voltage; and configuring, by the calibration device, a DC offset correction (DCOC) digital to analog convertor (DAC) with the offset correction voltages for the different gain steps of the VGA.

10. The method of claim 9, wherein a feedback factor of the VGA is approximately constant across the different gain steps of the VGA, and wherein the method further comprises calculating the first offset voltage and calculating the second offset voltage in accordance with $$V_{OS1} = \frac{V_{out2} - V_{out1}}{(G_2 - G_1)} - I_{DCOC'}R$$

and $$V_{OS2} = \frac{G_2 V_{out1} - G_1 V_{out2}}{G_2 - G_1},$$

wherein $V_{OS1}$ is the first offset voltage, wherein $V_{OS2}$ is the second offset voltage, wherein $V_{out1}$ is the first output voltage, wherein $V_{out2}$ is the second output voltage, wherein $G_1$ is the first gain step, wherein $G_2$ is the second gain step, and wherein $I_{DCOC'}R$ is a calibration offset correction voltage applied, by the DCOC DAC, to the VGA while measuring the first output voltage and the second output voltage.

11. The method of claim 10 further comprising calculating the offset correction voltages for different gain steps of the VGA comprises calculating an offset correction voltage for a gain step in accordance with $$I_{DCOC}R = \frac{-GV_{OS1} - V_{OS2}}{G},$$

wherein $I_{DCOC}R$ is the offset correction voltage, and wherein $G$ is the gain step.

12. The method of claim 9, wherein a feedback factor of the VGA varies across the different gain steps of the VGA, and wherein the method further comprises calculating the first offset voltage and calculating the second offset voltage in accordance with $$V_{OS1} = \frac{V_{out2}f_2 - V_{out1}f_1}{G_2 f_2 - G_1 f_1} - I_{DCOC'}R$$

and $$V_{OS2} = \frac{G_2 V_{out1} - G_1 V_{out2}}{\frac{G_2}{f_1} - \frac{G_1}{f_2}},$$

wherein $V_{OS1}$ is the first offset voltage, wherein $V_{OS2}$ is the second offset voltage, wherein $V_{out1}$ is the first output voltage, wherein $V_{out2}$ is the second output voltage, wherein $G_1$ is the first gain step, wherein $G_2$ is the second gain step, wherein $I_{DCOC'}R$ is a calibration offset correction voltage applied, by the DCOC DAC, to the VGA while measuring the first output voltage and the second output voltage, wherein $f_1$ is a first feedback factor of the VGA corresponding to the first gain step, and wherein $f_2$ is a second feedback factor of the VGA corresponding to the second gain step.

13. The method of claim 12 further comprising calculating the offset correction voltages for different gain steps of the VGA comprises calculating an offset correction voltage for a gain step in accordance with $$I_{DCOC}R = \frac{-GV_{OS1} - \frac{V_{OS2}}{f}}{G},$$

wherein $I_{DCOC}R$ is the offset correction voltage, wherein $G$ is the gain step, and wherein $f$ is a feedback factor of the VGA corresponding to the gain step.

14. The method of claim 9, wherein the DCOC DAC applies a first calibration offset correction voltage while measuring the first output voltage and applies a second calibration offset correction voltage while measuring the second output voltage, wherein the first calibration offset correction voltage and the second calibration offset correction voltage are different, and wherein the method further comprises calculating the first offset voltage and calculating the second offset voltage in accordance with $$V_{OS1} = \frac{V_{out2}f_2 - V_{out1}f_1}{G_2 f_2 - G_1 f_1} + \left(\frac{I_{DCOC1}RG_1 - I_{DCOC2}RG_2}{G_2 f_2 - G_1 f_1}\right)$$

and $$V_{OS2} = \frac{G_2 V_{out1} - G_1 V_{out2}}{\frac{G_2}{f_1} - \frac{G_1}{f_2}} - \left(\frac{I_{DCOC1}RG_1 G_2 - I_{DCOC2}RG_1 G_2}{\frac{G_2}{f_1} - \frac{G_1}{f_2}}\right),$$

wherein $V_{OS1}$ is the first offset voltage, wherein $V_{OS2}$ is the second offset voltage, wherein $V_{out1}$ is the first output voltage, wherein $V_{out2}$ is the second output voltage, wherein $G_1$ is the first gain step, wherein $G_2$ is the second gain step, wherein $I_{DCOC1}R$ is the first calibration offset correction voltage, wherein $I_{DCOC2}R$ is the second calibration offset correction voltage, wherein $f_1$ is a first feedback factor of the VGA corresponding to the first gain step, and wherein $f_2$ is a second feedback factor of the VGA corresponding to the second gain step.

15. The method of claim 9 further comprising taking no more than two output voltage measurements for each calibration process.

16. A calibration system comprising:
- a signal circuit comprising:
  - a variable gain amplifier (VGA); and
  - a DC offset correction (DCOC) digital to analog convertor (DAC) applying an offset correction voltage to the VGA; and
- a calibration circuit electrically connected to the signal circuit, wherein the calibration circuit:
  - measures a first output voltage of a variable gain amplifier (VGA) when the VGA is set at a first gain setting;
  - measures a second output voltage of the VGA when the VGA is set at a second gain setting different from the first gain setting;
  - calculates an offset voltage of the signal circuit and an internal offset voltage of the VGA using the first output voltage and the second output voltage; and
  - calculates offset correction voltages corresponding to different gain settings of the VGA in accordance with the offset voltage of the signal circuit and the internal offset voltage of the VGA.

17. The calibration system of claim 16, wherein the calibration circuit is further configured to program the DCOC DAC with the offset correction voltages corresponding to the different gain settings of the VGA.

18. The calibration system of claim 16, wherein the calibration circuit comprises a baseband chip.

19. The calibration system of claim 16, wherein the signal circuit comprises a low noise amplifier, a mixer, a transimpedance amplifier, a low pass filter, or a combination thereof.

20. The calibration system of claim 16, wherein the signal circuit comprises an analog to digital convertor (ADC) connected to an output of the VGA, wherein the first output voltage and the second output voltage are measured using the ADC.

* * * * *